United States Patent [19]

Sano

[11] Patent Number: 4,485,318

[45] Date of Patent: Nov. 27, 1984

[54] INTERFACE CIRCUIT FOR AN INTEGRATED INJECTION LOGIC CIRCUIT

[75] Inventor: Jun Sano, Tokyo, Japan

[73] Assignee: Tokyo Shibaura Denki Kabushiki Kaisha, Japan

[21] Appl. No.: 356,757

[22] Filed: Mar. 10, 1982

[30] Foreign Application Priority Data

Mar. 18, 1981 [JP] Japan .................. 56-39237

[51] Int. Cl.³ ................. H03K 19/092; H03K 19/091
[52] U.S. Cl. ................... 307/475; 307/443; 307/477
[58] Field of Search ............. 307/443, 446, 459, 475, 307/477; 357/92; 330/288

[56] References Cited

U.S. PATENT DOCUMENTS

| | | | |
|---|---|---|---|
| 3,509,364 | 4/1970 | Buckley | 307/475 |
| 3,974,404 | 8/1976 | Davis | 307/475 |
| 4,100,431 | 7/1978 | Stipanuk | 307/475 |
| 4,246,500 | 1/1981 | Okada et al. | 357/92 X |
| 4,256,984 | 3/1981 | Kojima | 307/475 X |
| 4,358,689 | 11/1982 | Jarrett et al. | 307/475 X |

FOREIGN PATENT DOCUMENTS 2824141  6/1979  Fed. Rep. of Germany ...... 307/475

*Primary Examiner*—Larry N. Anagnos
*Attorney, Agent, or Firm*—Finnegan, Henderson, Farabow, Garrett & Dunner

[57] ABSTRACT

An interface circuit for an integrated injection logic circuit comprises a current mirror circuit having its input current value set by a first resistor and its input controlled by an output signal of the integrated injection logic circuit, a second resistor connected to a current path at the output side of the current mirror circuit, and output means connected to the current output terminal of the current mirror circuit.

8 Claims, 9 Drawing Figures

INTERFACE CIRCUIT FOR AN INTEGRATED INJECTION LOGIC CIRCUIT

BACKGROUND OF THE INVENTION

This invention relates to an interface circuit for an integrated injection logic circuit as used in an interface between the integrated injection logic circuit and the other circuit.

A fundamental circuit of the integrated injection logic circuit ($I^2L$ circuit) comprises, as shown in FIG. 1, a PNP transistor $Q_I$ as an injector and an output NPN transistor $Q_0$ having at least one open collector. Since a greater load cannot be driven with one transistor $Q_0$, an interface circuit is required for the $I^2L$ circuit to drive the other circuit, for example, a TTL circuit.

FIGS. 2 and 3 each show a conventional interface circuit as used in an interface circuit between an $I^2L$ circuit and a TTL circuit. The interface circuit as shown in FIG. 2 comprises three NPN transistors $Q_1$ to $Q_3$, three resistors $R_1$ to $R_3$ and one diode $D_1$. An output of an $I^2L$ inverting gate G as configured in FIG. 1 is applied to the base of the NPN transistor $Q_1$. The interface circuit as shown in FIG. 3 comprises two PNP transistors $Q_4$, $Q_5$, two NPN transistors $Q_6$, $Q_7$ and seven resistors $R_4$ to $R_{10}$. An output of an $I^2L$ inverting gate G as configured in FIG. 1 is applied through the resistor $R_5$ to the base of the PNP transistor $Q_4$. In the conventional interface circuit it is not possible to obtain an arbitrary output voltage and there is a disadvantage that high and low level output voltages are fixed to certain levels. In the interface circuit of FIG. 2, for example, a high level output voltage is $V_{CC} - 2V_F$ and a low level output voltage is $V_{CE}(sat)$ ($Q_3$). In the interface circuit as shown in FIG. 3 the high level output voltage is $V_{CC} - V_{CE}(sat)(Q_5) - V_{BE}(Q_7)$ and the low level output voltage is zero (ground potential).

SUMMARY OF THE INVENTION

It is accordingly an object of this invention to provide an interface circuit for an integrated injection logic circuit which can freely set the value of an output voltage.

According to this invention there is provided an interface circuit for an integrated injection logic circuit comprising a first resistor, a current mirror circuit having its input current value set by a first resistor and having its input controlled by an output signal of the integrated injection logic circuit, a second resistor inserted in an electric current path at the output side of the current mirror circuit, and an output means connected to the output terminal of the current mirror circuit.

According to another embodiment of this invention there is provided an interface circuit for an integrated injection logic circuit which comprises a first resistor, a first current mirror circuit having its input current value set by the first resistor and having its input controlled by an output signal of the integrated injection logic circuit, a second current mirror circuit connected to receive an input current set by a second resistor and having its current output terminal connected at a common junction to a current output terminal of said first current mirror circuit, a third resistor connected to a common current path at the output side of the first and second current mirror circuits, and input means connected to the common current path of the first and second current mirror circuits.

DETAILED DESCRIPTION OF THE PREFERRED EMBODIMENTS

Figure 4:
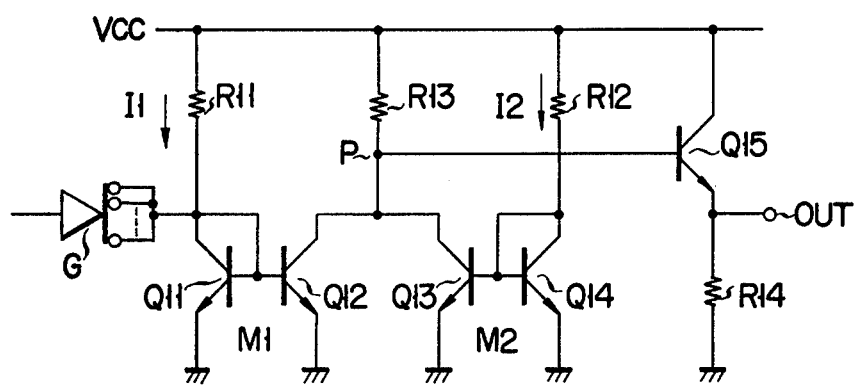
FIG. 4 is an interface circuit for an integrated injection logic circuit according to one embodiment of this invention.

FIG. 4 shows an interface circuit for an integrated injection logic circuit according to one embodiment of this invention. The FIG. 4 circuit comprises two current mirror circuits $M_1$, $M_2$, an NPN transistor $Q_{15}$ and four resistors $R_{11}$ to $R_{14}$. The current mirror circuit $M_1$ comprises two NPN transistors $Q_{11}$, $Q_{12}$ having their bases connected in common and their emitter areas equal to each other. The emitters of the NPN transistors $Q_{11}$, $Q_{12}$ are each connected to ground and the collector-to-base path of the NPN transistor $Q_{11}$ is short-circuited. Likewise, the other current mirror circuit $M_2$ comprises two NPN transistors $Q_{13}$, $Q_{14}$ having their bases connected in common and their emitter areas equal to each other. The emitters of the NPN transistors $Q_{13}$, $Q_{14}$ are grounded and a collector-to-base path of the NPN transistor $Q_{14}$ is short-circuited. To a common junction of the bases of the NPN transistors $Q_{11}$, $Q_{12}$ in the current mirror circuit $M_1$ is connected an output terminal of an $I^2L$ inverting gate G at an output stage of the $I^2L$ circuit. A resistor $R_{11}$ is connected between the collector of the NPN transistor $Q_{11}$ at the input side of the current mirror circuit $M_1$ and the positive terminal of a power source $V_{CC}$ to set an input current value $I_1$ of the current mirror circuit $M_1$. Likewise, a resistor $R_{12}$ is connected between the collector of the NPN transistor $Q_{14}$ at the input side of the other current mirror circuit $M_2$ and the positive terminal of the power source $V_{CC}$ to set an input current value $I_2$ of the current mirror circuit $M_2$. The collectors of the NPN transistors $Q_{12}$, $Q_{13}$ at the output side of both the current mirror circuits $M_1$, $M_2$ are connected to each other and a resistor $R_{13}$ is connected between a junction P of the collectors of the transistors $Q_{12}$, $Q_{13}$ and the positive terminal of the power source $V_{CC}$. The NPN transistor $Q_{15}$ and emitter resistor $R_{14}$ of the transistor $Q_{15}$ constitutes an emitter follower output circuit and the base of the NPN transistor $Q_{15}$ in the emitter follower output circuit is connected to the junction point P. An output terminal Out is connected to the emitter of the NPN transistor $Q_{15}$ and also to the input terminal of the other circuit such as a TTL circuit.

The operation of the interface circuit will be explained below.

Figure 1:
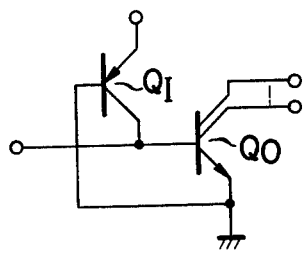
FIG. 1 is a circuit diagram showing a fundamental circuit of an $I^2L$ circuit.
Figure 2:
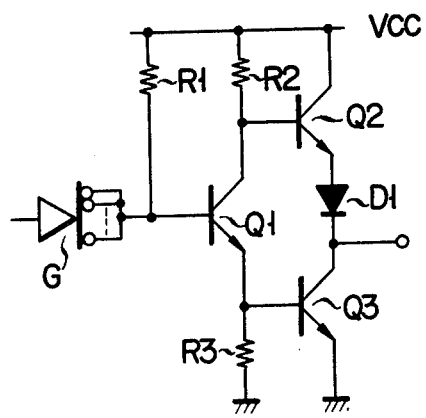
FIG. 2 is a conventional interface circuit as used in an interface between an $I^2L$ circuit and a TTL circuit.
Figure 3:
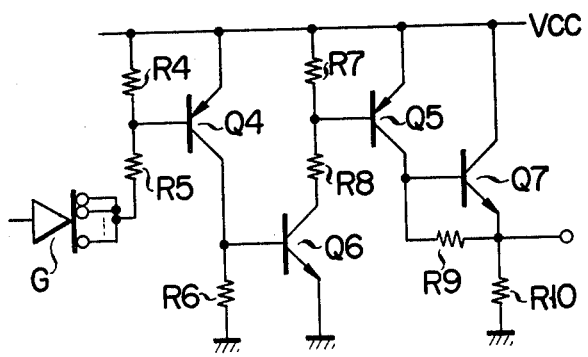
FIG. 3 is a conventional interface circuit as used in an interface between an $I^2L$ circuit and a TTL circuit.

With the $I^2L$ inverting gate G ON i.e. the NPN transistor $Q_0$ of FIG. 1 ON, an electric current $I_1$ through the resistor $R_{11}$ flows into the $I^2L$ inverting gate G, causing the NPN transistors $Q_{11}$, $Q_{12}$ to be cut off. As a result, the current mirror circuit $M_1$ is not operated. Since an electric current $I_2$ set by the resistor $R_{12}$ flows into the input side of the current mirror circuit $M_2$, an electric current $I_2$ of the same value also flows at the output side of the current mirror $M_2$. That is, the electric current $I_2$ flows through the resistor $R_{13}$. With the base-to-emitter voltage of the NPN transistor $Q_{15}$ represented by $V_{BE}(Q_{15})$, an output voltage $V_O$ on the output terminal Out is given by the following equation:

$$V_O = V_{CC} - I_2 \cdot R_{13} - V_{BE}(Q_{15}) \tag{1}$$

That is, the output voltage $V_O$ is equal to value by subtracting a voltage drop $I_2 \cdot R_{13}$ through the resistor $R_{13}$ and base-to-emitter voltage $V_{BE}(Q_{15})$ of the NPN transistor $Q_{15}$ from the power source voltage $V_{CC}$. At this time, the value of the output voltage $V_O$ corresponds to a value at the high level output time.

With the I²L inverting gate G OFF, the electric current $I_1$ through the resistor $R_{11}$ flows through the current mirror circuit $M_1$ and thus flows through the NPN transistor $Q_{12}$ at the output side of the current mirror circuit $M_1$. As a result, an electric current corresponding to a sum of $I_1$ and $I_2$ flows through the resistor $R_{13}$ and at this time the output voltage $V_O$ on the output terminal Out can be given by:

$$V_O = V_{CC} - (I_1 + I_2) \cdot R_{13} - V_{BE}(Q_{15}) \tag{2}$$

In this case, a voltage drop through the resistor $R_{13}$ becomes greater than the counterpart in the equation (1) and at this time a value of the output voltage $V_O$ corresponds to a value at the low level output time.

Here, $$I_1 = \frac{V_{CC} - V_{BE}(Q_{11})}{R_{11}} \tag{3}$$

$$I_2 = \frac{V_{CC} - V_{BE}(Q_{14})}{R_{12}} \tag{4}$$

with $V_{OL}$ and $V_{OH}$ representing the output voltage $V_O$ at the low level time and output voltage $V_O$ at the high level output voltage $V_O$, respectively, the equations (1) and (2) can be rewritten as follows:

$$V_{OH} = \frac{R_{13}}{R_{12}} (V_{CC} - V_{BE}(Q_{14})) - V_{BE}(Q_{15}) \tag{5}$$

$$V_{OL} = V_{CC} - \frac{R_{13}}{R_{11}} (V_{CC} - V_{BE}(Q_{11})) - \tag{6}$$

$$\frac{R_{13}}{R_{12}} (V_{CC} - V_{BE}(Q_{14})) - V_{BE}(Q_{15})$$

where
$V_{BE}(Q_{11})$: the base-to-emitter voltage of the NPN transistor $Q_{11}$
$V_{BE}(Q_{14})$: the base-to-emitter voltage of the NPN transistor $Q_{14}$ As evident from the equations (5) and (6) the output voltages at the high and low level output times can be freely set by a ratio of the resistances of the resistors $R_{11}$, $R_{12}$ and $R_{13}$. Thus, the output voltage can be adjusted with high accuracy in obtaining an integrated circuit.

Figure 5:
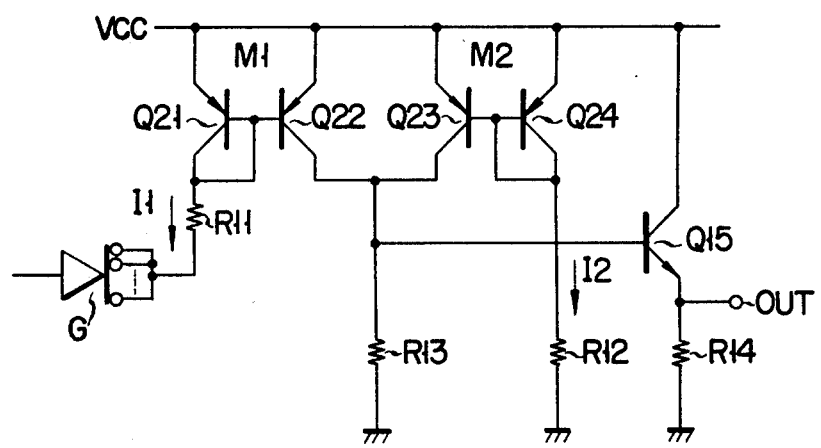
FIGS. 5 to 9 each show an interface circuit for an integrated injection logic circuit according to another embodiment of this invention.

FIG. 5 shows an interface circuit according to another embodiment of this invention, in which two current mirror circuits $M_1$, $M_2$ are provided, one being constituted of two PNP transistors $Q_{21}$, $Q_{22}$ and the other being constituted of two PNP transistors $Q_{23}$, $Q_{24}$.

In this case, an output voltage $V_O$ becomes equal to a value as obtained by subtracting a basse-to-emitter voltage $V_{BE}(Q_{15})$ of an NPN transistor from a voltage drop through a resistor $R_{13}$. With an I²L inverting gate G ON the output voltage $V_O$ becomes a high level $V_{OH}$ and with the I²L inverting G OFF the output voltage $V_O$ becomes a low level $V_{OL}$. The values of $V_{OH}$ and $V_{OL}$ are given by:

$$V_{OH} = \left( \frac{V_{CC} - V_{BE}(Q_{21})}{R_{11}} + \frac{V_{CC} - V_{BE}(Q_{24})}{R_{12}} \right) R_{13} - \tag{7}$$

$$V_{BE}(Q_{15})$$

$$V_{OL} = \frac{V_{CC} - V_{BE}(Q_{24})}{R_{12}} R_{13} \tag{8}$$

where
$V_{BE}(Q_{21})$: the base-to-emitter voltage of the PNP transistor $Q_{21}$
$V_{BE}(Q_{24})$: the base-to-emitter voltage of the PNP transistor $Q_{24}$ Even in this circuit, the values of the output voltages $V_{OH}$, $V_{OL}$ can be freely set by a ratio of the resistances of the resistors $R_{11}$, $R_{12}$ and $R_{13}$.

Figure 6:
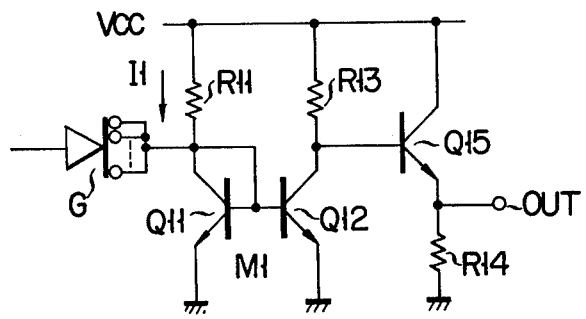

An interface circuit as shown in FIG. 6 corresponds to a circuit as obtained by eliminating a current mirror circuit $M_2$ and resistor $R_{12}$ from the FIG. 4 circuit. In this circuit, with an I²L inverting gate G ON an output voltage $V_{OH}$ at the high level time is fixed at a value $V_{CC} - V_{BE}(Q_{15})$. With the I²L inverting gate G OFF the output voltage $V_{OL}$ at the low level time becomes a value $V_{CC} - I_1 \cdot R_{13} - V_{BE}(Q_{15})$. In this circuit, only the output voltage $V_{OL}$ at the low level time can be freely varied by setting a ratio of the resistances of resistors $R_{11}$, $R_{13}$.

Figure 7:
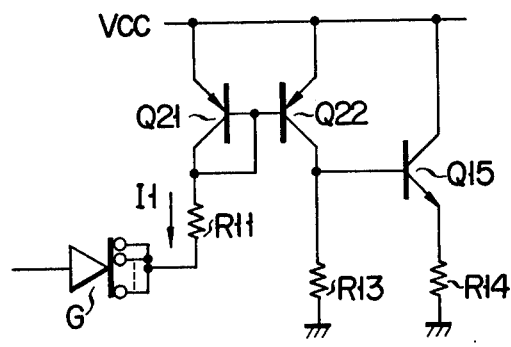

FIG. 7 shows an interface circuit in which the current mirror circuit $M_1$ of FIG. 6 is replaced by a current mirror circuit comprised of two PNP transistors $Q_{21}$, $Q_{22}$. In this circuit, with the I²L inverting gate G OFF an output voltage $V_{OL}$ at the lower level time is fixed at a low level i.e. at a ground level. With the I²L inverting gate G ON, the output voltage $V_{OH}$ at a high level time becomes a value $I_1 \cdot R_{13} - V_{BE}(Q_{15})$. In this circuit, only an output voltage $V_{OH}$ at the high level time can be freely varied by setting a ratio of the resistances of resistors $R_{11}$, $R_{13}$.

This invention is not restricted to the above-mentioned embodiments. Although this invention has been explained in connection with, for example, the case where two transistors of each of the current mirror circuits $M_1$, $M_2$ have the equal emitter areas, a greater or a smaller output current may be taken from the output side of the circuit with the emitter areas of the two transistors set at a predetermined ratio.

Figure 8:
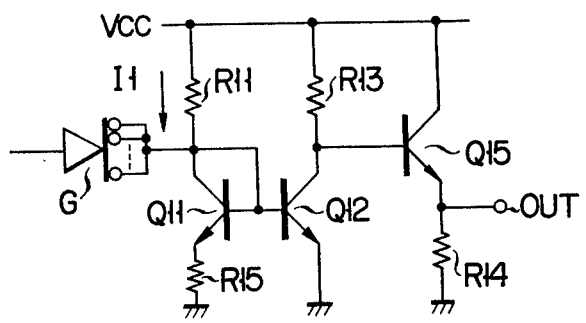
Figure 9:
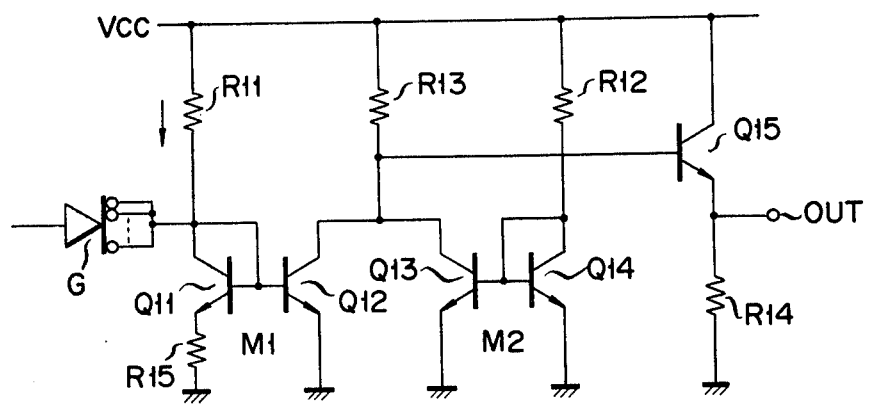

Instead of setting the ratio of the emitter areas of the pair of transistors constituting the current mirror circuit, a resistor $R_{15}$ may be connected to the emitter circuit of one of a pair of transistors in the current mirror circuit as shown in FIGS. 8 and 9 and, by so doing, a greater or a smaller output current may be taken from an output side. Since in the circuit as shown in FIGS. 8 and 9 the resistor $R_{15}$ is connected to the emitter circuit of the NPN transistor $Q_{11}$ at the input side of the current mirror circuit $M_1$, a greater output current is taken from the output side.

What is claimed is:

1. An interface circuit for use with an integrated injection logic circuit, comprising:

first and second power source terminals;

first and second resistors each having a first end connected to said first power source terminal;

a current mirror circuit connected to said integrated injection logic circuit and having an input current path and an output current path, said input and output current mirror paths being respectively connected between said second power source terminal and the respective second ends of said first and second resistors, and whereby the input current value of said current mirror circuit is set by said first resistor and the input of said current mirror circuit is controlled by the output signal of said integrated injection logic circuit; and output means connected to said second end of said second resistor.

2. The interface circuit for an integrated injection logic circuit according to claim 1, in which said output means includes an emitter follower circuit comprising a transistor having its base connected to the second terminal of said second resistor and a resistor connected between the emitter and the second power source terminal.

3. The interface circuit according to claim 1, wherein said current mirror circuit comprises a first transistor, which has a collector and a base both connected to said second end of said first resistor and an emitter connected to said second power source terminal, and a second transistor, which has a collector connected to said second end of said second resistor, a base connected to said base of said first transistor and an emitter connected to said second power source terminal.

4. The interface circuit according to claim 3, wherein an emitter circuit of at least one of said first and second transistors includes a third resistor.

5. An interface circuit for an integrated injection logic circuit, comprising:

first and second power source terminals;

first, second and third resistors each having a first end connected to said first power source terminal;

a first current mirror circuit connected to said integrated injection logic circuit and having an input current path and an output current path, said input and output current mirror paths being respectively connected between said second power source terminal and the respective second ends of said first and third resistors, whereby the input current value of said first current mirror circuit is set by said first resistor and the input of said first current mirror circuit is controlled by the output signal of said integrated injection logic circuit;

a second current mirror circuit having an input current path and an output current path, said input and output current mirror paths being respectively connected between said second power source terminal and the respective second ends of said second and third resistors, and whereby the input current value of said second current mirror circuit is set by said second resistor; and output means connected to said second end of said third resistor.

6. The interface circuit for an integrated injection logic circuit according to claim 5, in which said output means includes an emitter follower circuit comprising a transistor having its base connected to the second terminal of said third resistor and an emitter resistor.

7. The interface circuit according to claim 5, wherein said first current mirror circuit comprises a first transistor, which has a collector and a base both connected to said second end of said first resistor and an emitter connected to said second power source terminal, and a second transistor, which has a collector connected to said second end of said third resistor, a base connected to said base of said first transistor and an emitter connected to said second power source terminal, and wherein said second current mirror circuit comprises a third transistor, which has a collector and a base both connected to said second end of said second resistor and an emitter connected to said second power source terminal, and a fourth transistor, which has a collector connected to said second end of said third resistor, a base connected to said base of said third transistor and an emitter connected to said second power source terminal.

8. The interface circuit according to claim 7, wherein an emitter circuit of at least one of said first to fourth transistors includes a fourth resistor.

* * * * *